United States Patent
Lin et al.

(10) Patent No.: US 7,990,470 B2
(45) Date of Patent: Aug. 2, 2011

(54) IMAGE SENSOR MODULE FOR CAMERA DEVICE

(75) Inventors: Wen-Hwa Lin, Taipei Hsien (TW);
Chen-Kuang Yeh, Taipei Hsien (TW);
Xiang Huang, Foshan (CN);
Wan-Cheng Xie, Foshan (CN);
Shao-Guang Mo, Foshan (CN)

(73) Assignees: Premier Image Technology(China) Ltd., Foshan, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 708 days.

(21) Appl. No.: 12/013,916

(22) Filed: Jan. 14, 2008

(65) Prior Publication Data

US 2009/0040368 A1    Feb. 12, 2009

(30) Foreign Application Priority Data

Aug. 9, 2007   (CN) .......................... 2007 1 0201326

(51) Int. Cl.
*H04N 5/225*   (2006.01)
*G03B 17/00*   (2006.01)

(52) U.S. Cl. ..................... 348/374; 396/542; 348/340

(58) Field of Classification Search .............. 348/373, 348/374, 375, 376, 340
See application file for complete search history.

(56) References Cited

U.S. PATENT DOCUMENTS

| | | | |
|---|---|---|---|
| 4,594,613 A * | 6/1986 | Shinbori et al. | 348/340 |
| 5,040,069 A * | 8/1991 | Matsumoto et al. | 348/76 |
| 7,583,309 B2 * | 9/2009 | Aizawa et al. | 348/340 |
| 2005/0270403 A1 * | 12/2005 | Adachi et al. | 348/340 |
| 2007/0223913 A1 | 9/2007 | Lee | |

FOREIGN PATENT DOCUMENTS

| | | |
|---|---|---|
| CN | 1516283 A | 7/2004 |
| JP | 2006340299 A | 12/2006 |

* cited by examiner

*Primary Examiner* — Lin Ye
*Assistant Examiner* — Ahmed Berhan
(74) *Attorney, Agent, or Firm* — Jeffrey T. Knapp (57) ABSTRACT

An image sensor module includes a circuit board (20), an image sensor (10) and a supporting board (30). The circuit board has a plurality of circuits formed thereon. The image sensor is arranged on one side of the circuit board and is electrically connected to the circuit board. The circuit board defines at least one through opening (22) therein. The supporting board is arranged on an opposite side of the circuit board. A protrusion (31) extends outwardly from the supporting board through the at least one through opening of the circuit board. The image sensor is mounted on the protrusion.

12 Claims, 7 Drawing Sheets

IMAGE SENSOR MODULE FOR CAMERA DEVICE

BACKGROUND OF THE INVENTION

1. Field of the Invention

The present invention relates generally to a camera device, and particularly to an image sensor module of the camera device having improved position precision.

2. Description of related art

In recent years, digital cameras and digital video cameras are in widespread use and are provided with an image sensor module to provide an image-capturing function.

Figure 7:
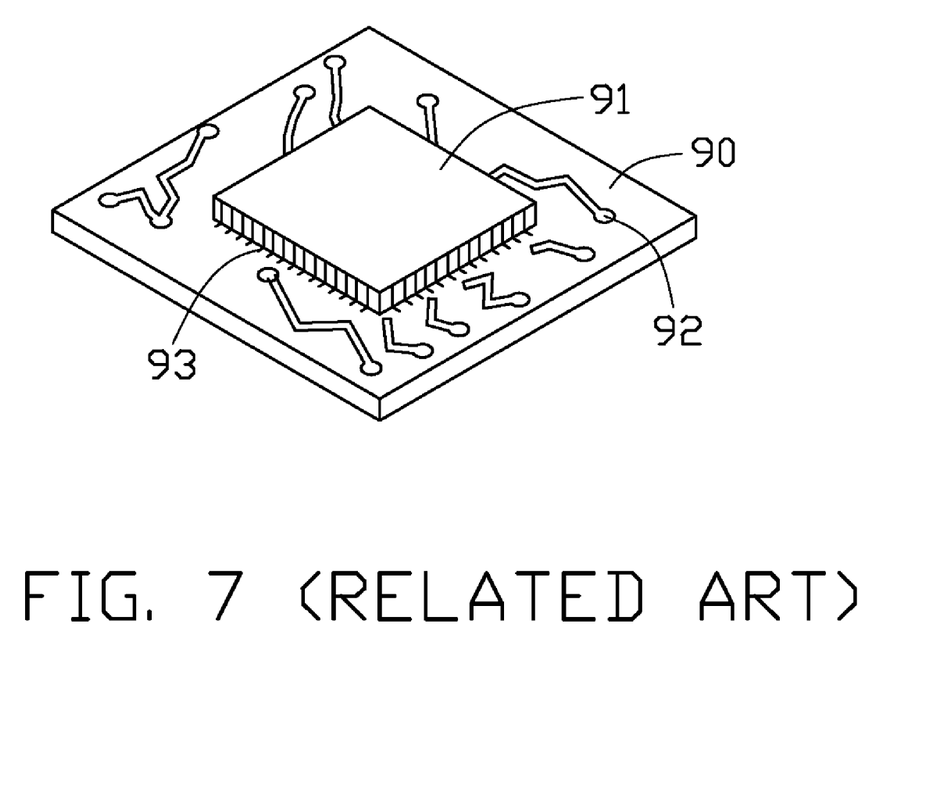
FIG. 7 is an isometric, assembled view of a related image sensor module.

Referring to FIG. 7, a general image sensor module includes a circuit board 90 and an image sensor 91 arranged on the circuit board 90. A plurality of circuits 92 are printed on the circuit board 90. The image sensor 91 is either a charge coupled device (CCD) sensor or a complementary metal oxide semiconductor (CMOS) sensor. A light receiving section is formed on a top side of the image sensor 91. Contact terminals 93 of the image sensor 91 are electrically connected to the circuits of the circuit board 90 by soldering. A number of pads (not shown) thus are formed between the contact terminals 93 of the image sensor 91 and the circuit board 90. During operation of the camera, circuits of the light receiving section of the image sensor 91 are driven at a high speed frequency to transform image signals into electrical signals. The electrical signals are then transferred to the circuit board 90 through the contact terminals 93 of the image sensor 91 and the pads of the circuit board 90 to control focusing of the camera.

However, the pads formed on the circuit board 90 usually are different from each other. In other words, the pads have various thicknesses. Thus the image sensor 91 arranged on the pads is usually aslant. When the image sensor module is mounted to a lens module, the light receiving section formed on the top side of the image sensor 91 is aslant. An optical axis of the image sensor module is offset from an optical centre of the lens. Thus the image of the image sensor 91 usually generates Coma aberration, which resulting in distortion of the image.

Therefore, a new image sensor module for the camera device is desired to overcome the above describe shortcomings.

SUMMARY OF THE INVENTION

In accordance with the present embodiment, an image sensor module includes a circuit board, an image sensor and a supporting board. The circuit board has a plurality of circuits formed thereon. The image sensor is arranged on one side of the circuit board and is electrically connected to the circuit board. The circuit board defines at least one through opening therein. The supporting board is arranged on an opposite side of the circuit board. A protrusion extends outwardly from the supporting board through the at least one through opening of the circuit board. The image sensor is mounted on the protrusion.

Other advantages and novel features of the present invention will be drawn from the following detailed description of a preferred embodiment of the present invention with attached drawings, in which:

BRIEF DESCRIPTION OF THE DRAWINGS

The present invention is described in greater detail hereinafter, by way of example only, through description of a preferred embodiment thereof and with reference to the accompanying drawing in which.

DETAILED DESCRIPTION OF THE INVENTION

Figure 1:
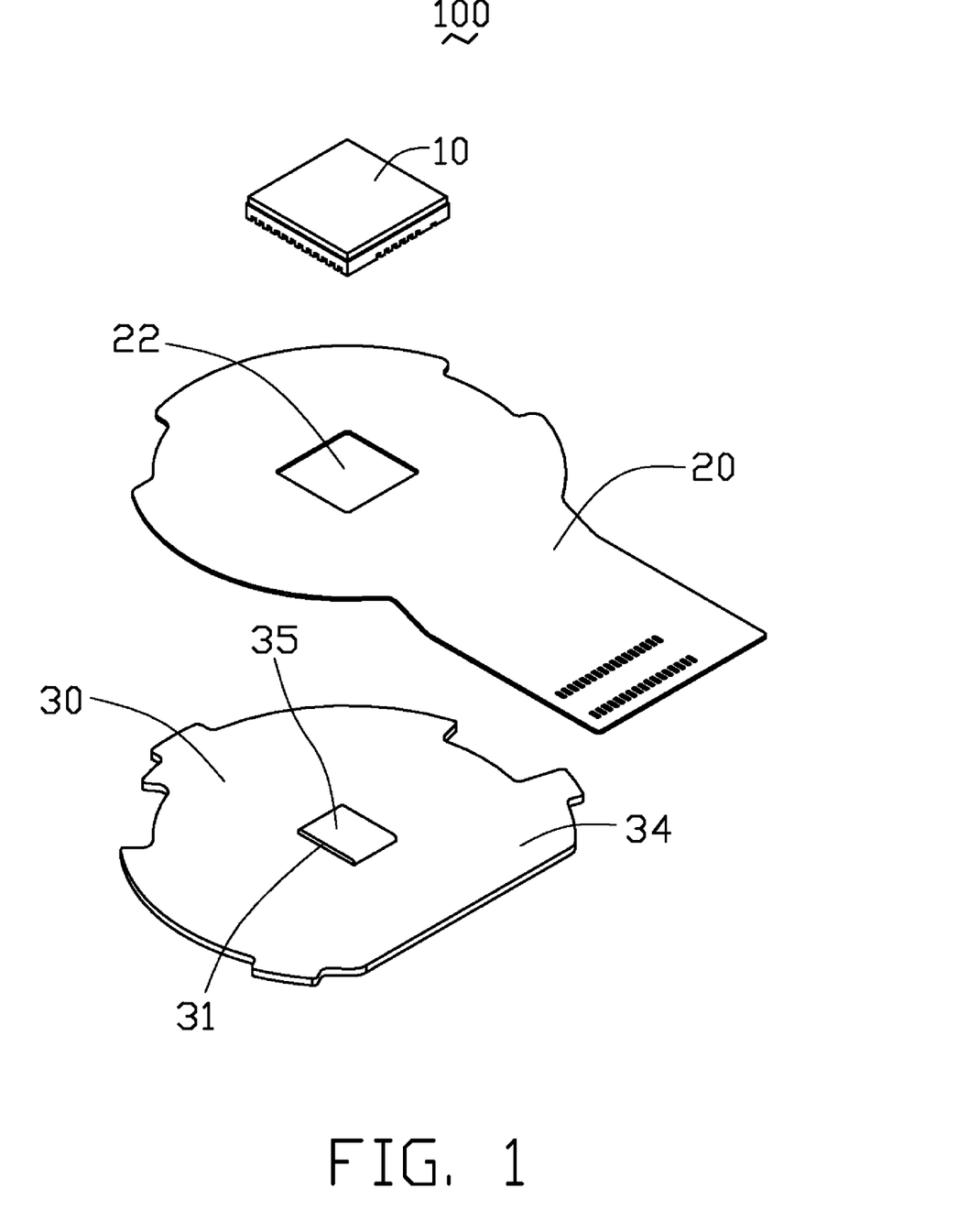
FIG. 1 is an isometric, explored view of an image sensor module of a present embodiment of the present invention.
Figure 2:
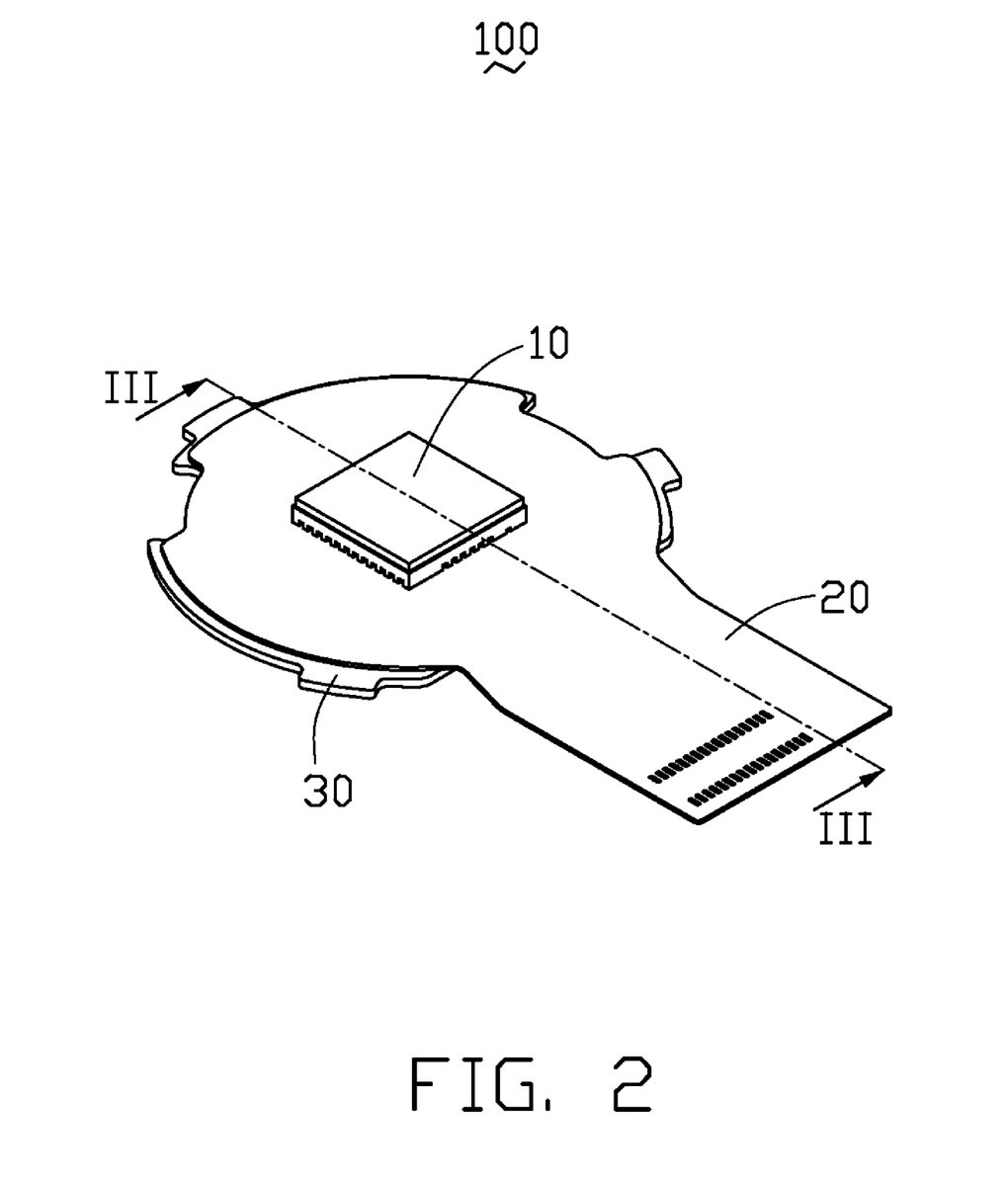
FIG. 2 is an assembled view of the image sensor module of FIG. 1.
Figure 3:
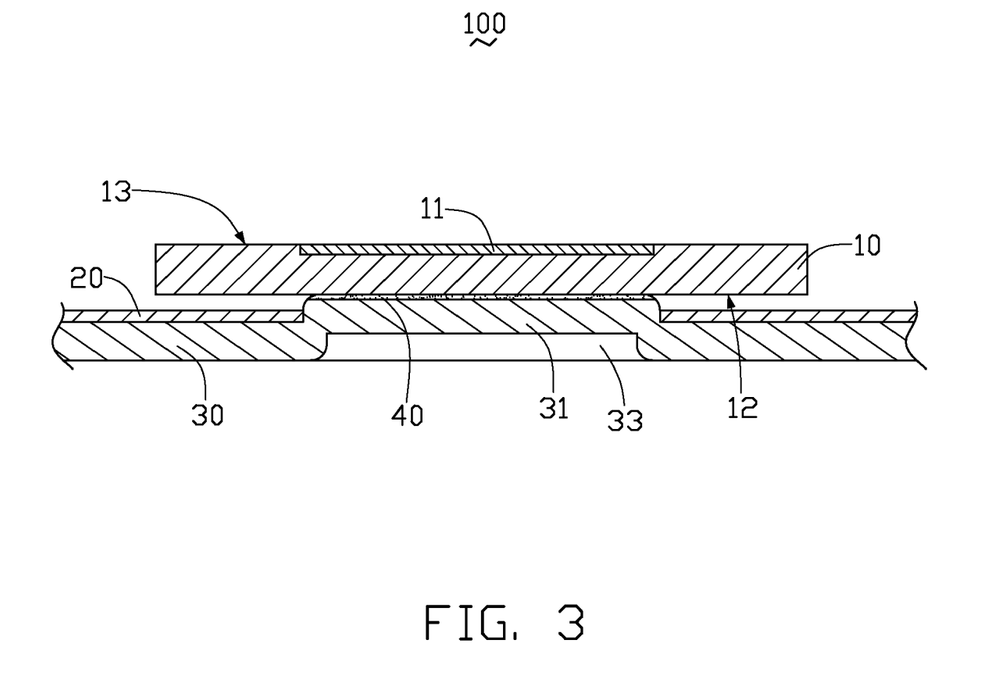
FIG. 3 is a cross-sectional view of the image sensor module of FIG. 2 taken along line III-III.

The detailed explanation of an image sensor module according to the present invention will now be made with reference to the drawings attached hereto. Referring to FIGS. 1-3, the image sensor module 100 includes a circuit board 20, an image sensor 10 and a supporting board 30. The image sensor module 100 can be used in a digital camera or a digital video camera to provide an image-capturing function.

The image sensor 10 is either a charge coupled device (CCD) sensor or a complementary metal oxide semiconductor (CMOS) sensor, which is controlled by a central processing unit (CPU, not shown). The image sensor 10 includes a top surface 13 and an opposite bottom surface 12. A light receiving section 11 is formed on the top surface 13 of the image sensor 10. A number of signal output terminals (not shown) are formed on the bottom surface 12 of the image sensor 10. When the image sensor module 100 is mounted to a camera, during focusing of the camera, circuits of the light receiving section 11 of the image sensor 10 are driven at a high speed frequency to transform image signals into electrical signals. The electrical signals are then transferred to the CPU. The CPU compares the image from a lens of the camera with the image in the image sensor 10. As the lens moves to a position where the image is the clearest, a stop signal is simultaneously sent to stop movement of the lens of the camera. Thus focusing of the camera is achieved.

The supporting board 30 is made of metal or plastic. A top side of the supporting board 30 forms a planar-shaped supporting surface 34. A protrusion extends upwardly from a central portion of the supporting surface 34. A concave 33 is defined in a bottom side of the supporting board 30 corresponding to the protrusion. In this embodiment, the protrusion is a block 31. The block 31 has a planar and square shaped top mounting surface 35. A size of the mounting surface 35 is smaller than that of the bottom surface 12 of the image sensor 10.

The circuit board 20 has a plurality of circuits printed thereon. The image sensor 10 is electrically connected to the circuits of the circuit board 20. A square-shaped through opening 22 is defined in a central portion of the circuit board 20 corresponding to the block 31 of the supporting board 30. The through opening 22 has a size being approximately the same or a little larger than that of the mounting surface 35 of the block 31, whilst being smaller than that of the bottom surface 12 of the image sensor 10.

When assembled, the circuit board 20 is mounted on the supporting surface 34 of the supporting board 30. The block 31 extends through the through opening 22 of the circuit board 20. A height of the block 31 is larger than a thickness of the circuit board 20, and thus the mounting surface 35 of the supporting board 30 is higher than the circuit board 20. The image sensor 10 is arranged on the mounting surface 35 of the block 31, and the signal output terminals of the image sensor 10 are electrically connected to the circuits of the circuit board 20 through wire bonding or SMT (surface mounting technology). Before mounting the image sensor 10 to the block 31, an adhesive layer 40 is applied on the mounting surface 35 of the block 31. The adhesive layer 40 can be made of thermosetting adhesives, UV (Ultraviolet Rays) adhesives or black adhesives. The image sensor 10 is thus adhered to the block 31 by the adhesive layer 40. As the block 31 of the supporting board 30 is higher than the circuit board 20, the image sensor 10 mounted on the block 31 is higher than and spaced from the circuit board 20, the connection of the image sensor 10 and the circuit board 20 no longer affect position of the image sensor 10. When the image sensor module 100 mounted to camera device, the light receiving section 11 formed on the top surface 13 of the image sensor 10 is horizontal. An optical axis of the image sensor module 100 overlaps an optical centre of the lens of the camera. Thus Coma aberration of the conventional image sensor module is avoided, resulting in accurately image-capturing.

Figure 4:
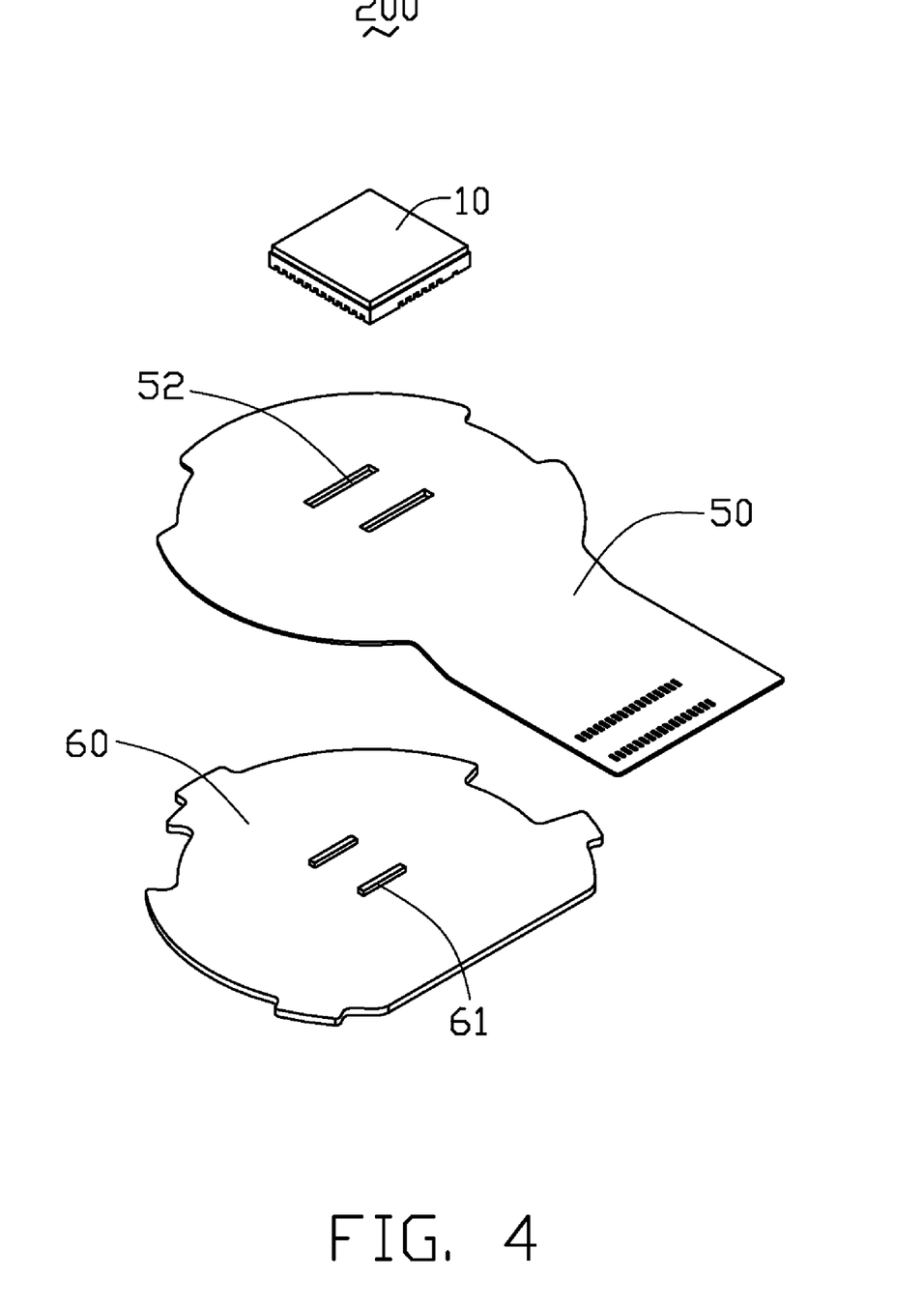
FIG. 4 is an isometric, explored view of the image sensor module according to an alternative embodiment of the present invention.

FIG. 4 shows a second embodiment of the image sensor module 200 according to the present invention. Similar to the first embodiment, the image sensor module 200 includes an image sensor 10, a circuit board 50 and a supporting board 60. The difference between the second embodiment and the first embodiment is that the protrusion formed on the supporting board 60 includes a pair of supporting members 61. The two supporting members 61 are identical to each other, and being arranged on the central of the supporting board 60 parallel to each other. A distance between the two supporting members 61 is smaller than a width of the image sensor 10. A top of each supporting member 61 is at the same level as that of the other supporting member 61, and thus the supporting members 61 has the same height relative to the supporting board 60. The circuit board 50 defines a pair of elongated through openings 52 corresponding to the supporting members 61. Each through opening 52 has a size being approximately the same or a little larger than that of the supporting member 61. When assembled, each supporting member 61 extends through one corresponding through opening 52 to support the image sensor 10 thereon. A height of each supporting member 61 is higher than the thickness of the circuit board 50, and thus the tops of the supporting members 61 are higher than the circuit board 50. The image sensor 10 mounted on the supporting members 61 is higher than the circuit board 50 and thus is spaced from the circuit board 50. The connection of the image sensor 10 and the circuit board 50 no longer affect position of the image sensor 10, and thus the image senor 10 can be mounted to the circuit board 50.

Figure 5:
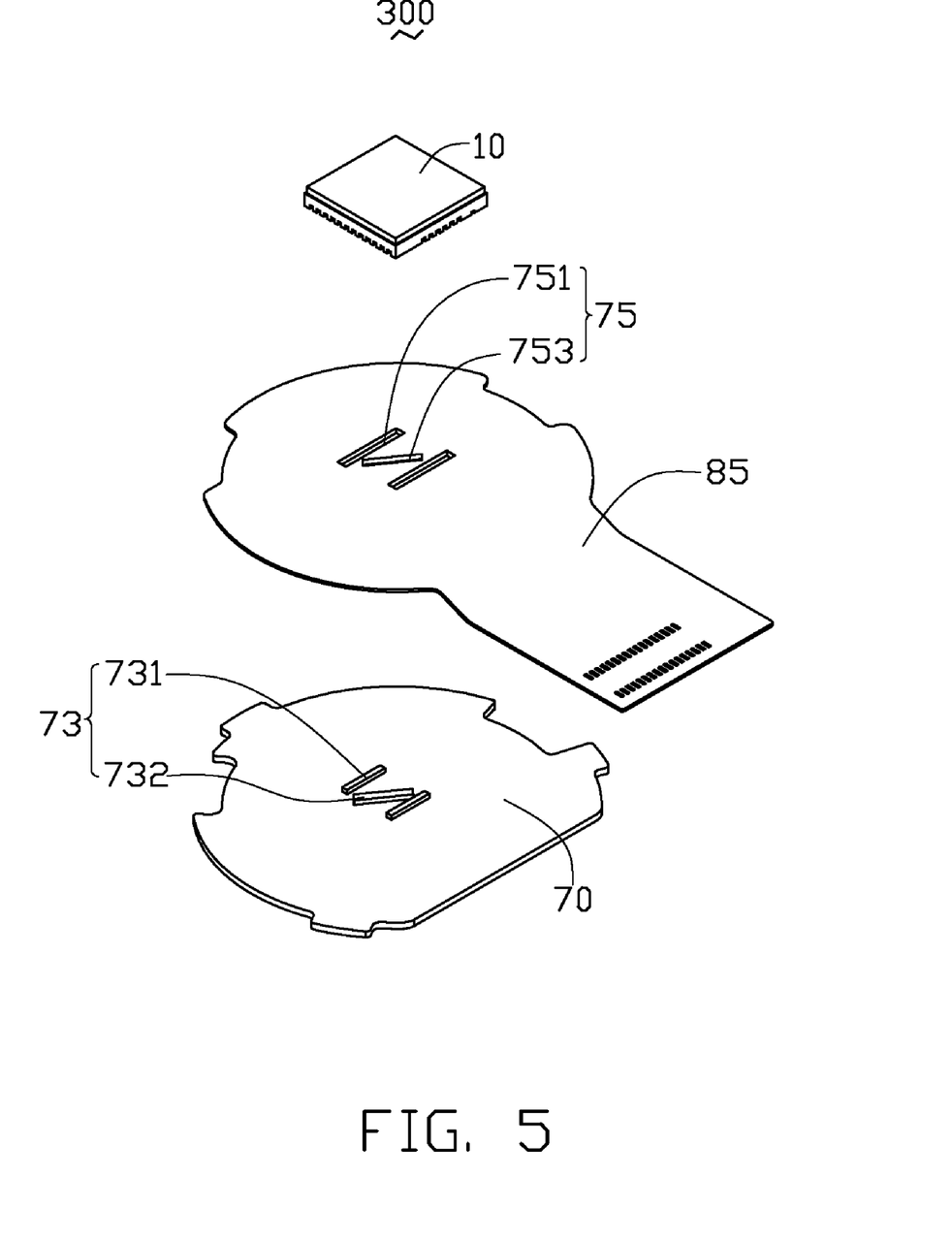
FIG. 5 is similar to FIG. 4, but shows a third embodiment of the image sensor module.

Referring to FIG. 5, the image sensor module 300 according to a third embodiment of the present invention is shown. The difference between the third embodiment and the first embodiment is that the protrusion formed on the supporting board 70 includes three supporting members 73, and the circuit board 85 defines three through openings 75 for extension of the supporting members 73 therethrough. The three supporting members 73 include a pair of parallel supporting members 731, and a third supporting member 732 arranged between and non-parallel to the parallel supporting members 731. A front end of the third supporting member 732 is located near a front end of the left parallel supporting member 73, whilst a rear end of the third supporting member 732 is located near a rear end of the right parallel supporting member 73. The three through openings 75 of the circuit board 85 also includes a pair of parallel through openings 751 and a third non-parallel through opening 753. After assembling of the image sensor module 300, the image sensor 10 is arranged on the three supporting members 73 and thus is spaced from the circuit board 85. The third supporting member 732 is configured for improving contacting area between the image sensor 10 and the supporting board 70, and thus to improve stableness of the image sensor 10.

Figure 6:
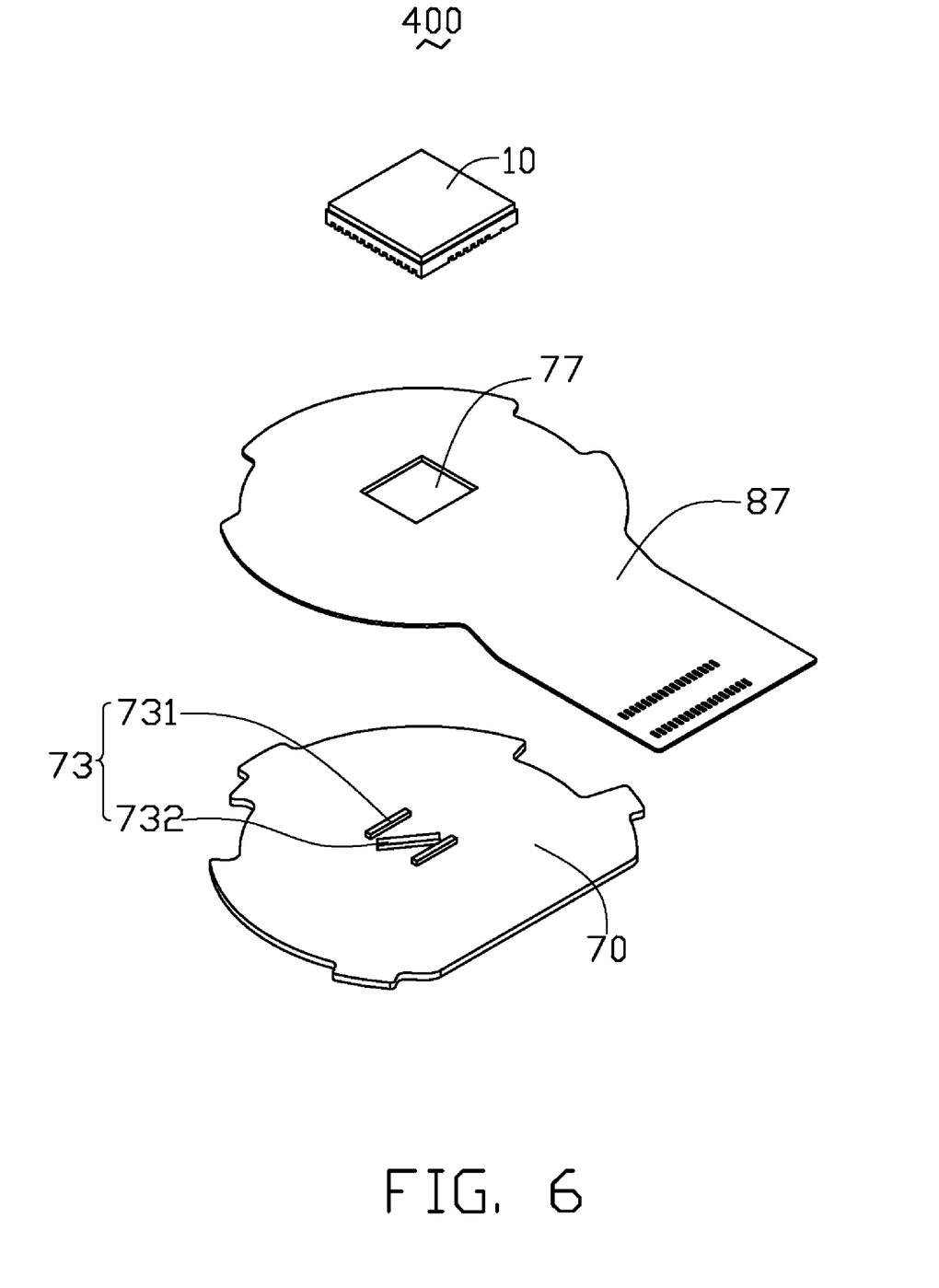
FIG. 6 is an isometric, explored view of the image sensor module according to a fourth embodiment of the present invention.

FIG. 6 shows the image sensor module 400 according to a fourth embodiment of the present invention. Similar to the third embodiment, the image sensor module 400 includes a circuit board 87, an image sensor 10 being electrically connected to the circuit board 87 and a supporting board 70 arranged under the circuit board 87 for supporting the image sensor 10. Also the supporting board 70 forms three supporting members 73, which includes a pair of parallel supporting members 731 and a third non-parallel supporting member 732. The difference between the fourth embodiment and the third embodiment is that the circuit board 87 only defines one square-shaped through opening 77 for all of the supporting members 73 extending therethrough. It is to be understood that the block 31/supporting members 61, 73 is configured for supporting the image sensor 10 thereon, the shape or number of the block 31/supporting members 61, 73 can be varied according to the size of the image sensor 10. The supporting board 30, 60, 70 can forms five blocks/supporting members thereon and even more, and the blocks/supporting members can be arranged parallel or one-parallel. Accordingly, the size of the block 31/supporting members 61, 73 can be larger than that of the image sensor 10, and in this situation the image sensor 10 can be electrically connected to the circuit board 20, 50, 85, 87 through wire bonding. The through opening(s) 22, 52, 75, 77 defined in the circuit board 20, 50, 85, 87 is configured for extension of the block 31/supporting members 61, 73 of the supporting board 30, 60, 70 to support the image sensor 10 thereon, the size of the through openings 22, 52, 75, 77 should not be smaller than the block 31/supporting members 61, 73. And the shape or number of the through opening(s) 22, 52, 75, 77 should be changed according to the shape or number of the block 31/supporting members 61, 73.

It can be understood that the above-described embodiment are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. An image sensor module comprising:
    a circuit board having a plurality of circuits formed thereon;
    an image sensor arranged on one side of the circuit board and being electrically connected to the circuit board, the circuit board defining at least one through opening therein; and
    a supporting board arranged on an opposite side of the circuit board, a protrusion extending outwardly from the supporting board through the through openings of the circuit board, a surface of the image sensor which faces to the supporting board being mounted on a top surface of the protrusion, wherein the protrusion comprises three supporting members, a pair of the three supporting members being parallel to each other, the third supporting member being arranged between the pair of supporting members and being non-parallel to the pair of supporting members.

2. The image sensor module of claim 1, wherein a terminal portion of the protrusion is outside the circuit board, and thus the image sensor is spaced from the circuit board.

3. The image sensor module of claim 1, wherein the protrusion comprises a square-shaped block, the block has a size being not larger than that of the image sensor, the image sensor being electrically connected to the circuit board.

4. The image sensor module of claim 1, wherein the protrusion comprises a square-shaped block, the block has a size being larger than that of the image sensor, the image sensor being electrically connected to the circuit board through wire bonding.

5. The image sensor module of claim 1, wherein the supporting members each has a same height relative to the supporting board.

6. The image sensor module of claim 5, wherein the circuit board defines a number of long and narrow through openings corresponding to the number of supporting members, the supporting members extending through the corresponding through openings.

7. The image sensor module of claim 5, wherein all of the supporting members extend through the through openings of the circuit board.

8. The image sensor module of claim 5, wherein the supporting members are parallel to each other.

9. The image sensor module of claim 1, wherein an adhesive layer is applied between the image sensor and the protrusion, the adhesive layer being one of thermosetting adhesives, UV adhesives and black adhesives.

10. An image sensor module comprising:
a supporting board forming a supporting surface, a protrusion extending upwardly from the mounting surface;
a circuit board being arranged on the supporting surface of the supporting board, the circuit board defining at least one through opening for extension of the protrusion therethrough, a thickness of the circuit board being smaller than that of the protrusion; and
an image sensor being arranged on the protrusion of the supporting board, a surface of the image sensor which faces to the supporting board being mounted on a top surface of the protrusion, the image sensor being spaced from the circuit board and being electrically connected to the circuit board, wherein the protrusion comprises three supporting members, a pair of the three supporting members being parallel to each other, the third supporting member being arranged between the pair of supporting members and being non-parallel to the pair of supporting members.

11. The image sensor module of claim 10, wherein the protrusion comprises a square-shaped block, the block has a size being not larger than that of the image sensor, the image sensor being electrically connected to the circuit board.

12. The image sensor module of claim 10, wherein the protrusion comprises a number of elongated supporting members, with a same height relative to the supporting board, the circuit board defining a number of long and narrow through openings corresponding to the number of supporting members, the supporting members extending through the respective through openings.

\* \* \* \* \*